(12) United States Patent
Yang et al.

(10) Patent No.: US 7,611,826 B2
(45) Date of Patent: Nov. 3, 2009

(54) PHOTOSENSITIVE RESIN COMPOSITION CONTROLLING SOLUBILITY AND PATTERN FORMATION METHOD OF DOUBLE-LAYER STRUCTURE USING THE SAME

(75) Inventors: Seok-Yoon Yang, Cheonan (KR); Gil-Lae Kim, Hwaseong-kun (KR); Chan-Seok Park, Hwaseong-kun (KR); Choon-Ho Park, Hwaseong-kun (KR); Soo-Guy Rho, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/351,398

(22) Filed: Jan. 9, 2009

(65) Prior Publication Data

US 2009/0191484 A1    Jul. 30, 2009

Related U.S. Application Data

(62) Division of application No. 10/675,455, filed on Sep. 30, 2003, now abandoned.

(30) Foreign Application Priority Data

Oct. 4, 2002    (KR) ............... 2002-0060500

(51) Int. Cl.
G03F 7/00    (2006.01)
G03F 7/004    (2006.01)

(52) U.S. Cl. ............... 430/311; 430/270.1; 430/5; 430/396; 430/905; 430/280.1; 430/286.1

(58) Field of Classification Search ............ 430/5, 430/311, 270.1, 280.1, 286.1, 396, 905
See application file for complete search history.

(56) References Cited

U.S. PATENT DOCUMENTS

| | | | |
|---|---|---|---|
| 4,716,194 A | 12/1987 | Walker et al. | |
| 4,749,727 A | 6/1988 | Tsuchiya et al. | |
| 5,251,071 A | 10/1993 | Kusukawa et al. | |
| 5,523,114 A | 6/1996 | Tong et al. | |
| 5,821,016 A | 10/1998 | Satoh et al. | |

(Continued)

FOREIGN PATENT DOCUMENTS

JP    11-338142    12/1992

(Continued)

OTHER PUBLICATIONS

Jo et al., "Structure and Adsorption of 3-acryloxypropyltrimethoxysilane", Journal of the American Chemical Society, V. 15, pp. 2444-2449 (1999).

Primary Examiner—Amanda C. Walke
(74) Attorney, Agent, or Firm—Cantor Colburn LLP (57) ABSTRACT

The present invention relates to a new photosensitive resin composition capable of solubility control and a pattern formation method of a double-layer structure using the same, and more particularly to a photosensitive resin composition that can control the γ-value using a new photopolymerization initiator and lower layer hardener and that can control a film thickness according to the exposure energy without pattern breakup, even with low exposure energy. This photosensitive resin composition is useful for color filters and overcoating materials of LCD (liquid crystal display) manufacturing processes.

14 Claims, 3 Drawing Sheets
(1 of 3 Drawing Sheet(s) Filed in Color)

U.S. PATENT DOCUMENTS

| | | |
|---|---|---|
| 5,827,626 A | 10/1998 | Kobayashi et al. |
| 6,013,415 A | 1/2000 | Sakurai et al. |
| 6,348,298 B1 | 2/2002 | Sakurai et al. |
| 6,413,686 B2 | 7/2002 | Kishimoto et al. |
| 6,534,235 B1 | 3/2003 | Hanabata et al. |
| 6,914,110 B2 | 7/2005 | Tsuji et al. |
| 7,005,231 B2 | 2/2006 | Tamaki et al. |
| 2004/0048200 A1 | 3/2004 | Ishibashi et al. |

FOREIGN PATENT DOCUMENTS

| | | |
|---|---|---|
| JP | 05273411 | 10/1993 |
| JP | 08-106163 | 4/1996 |
| JP | 09-061616 | 3/1997 |
| JP | 10-133370 | 5/1998 |
| JP | 10-186652 | 7/1998 |
| JP | 10-212448 | 8/1998 |
| JP | 11-038226 | 2/1999 |
| JP | 11-231124 | 8/1999 |
| JP | 2000-035670 | 2/2000 |
| JP | 2000-047020 | 2/2000 |
| JP | 2001-183829 | 7/2001 |
| JP | 2001-337219 | 12/2001 |
| JP | 2001-343515 | 12/2001 |
| JP | 2003-177227 | 6/2003 |
| KR | 10-1998-020319 | 6/1998 |
| KR | 10-1998-020614 | 6/1998 |
| KR | 19980068288 | 10/1998 |
| KR | 10-2000-0055255 | 9/2000 |
| KR | 10-0300426 | 6/2001 |
| KR | 10-2001-0111454 | 12/2001 |
| KR | 1020020054539 | 7/2002 |

PHOTOSENSITIVE RESIN COMPOSITION CONTROLLING SOLUBILITY AND PATTERN FORMATION METHOD OF DOUBLE-LAYER STRUCTURE USING THE SAME

CROSS-REFERENCE TO RELATED APPLICATION

This application is a divisional application of U.S. patent application Ser. No. 10/675,455, filed Sep. 30, 2003 now abandoned, which claims priority to Korean Patent Application No. 2002-0060500, filed on Oct. 4, 2002, in the Korean Intellectual Property Office, both of which are incorporated herein in its entirety by reference.

BACKGROUND OF THE INVENTION (a) Field of the Invention

The present invention relates to a new photosensitive resin composition controlling solubility by hardness control and a pattern formation method of a double-layer structure using the same, and more particularly to a photosensitive resin composition that differentiates film thickness during developing of a photosensitive solution in an LCD (liquid crystal display) manufacturing process, which is useful for a double-layer structured color filter and overcoating material.

(b) Description of the Related Art

The conventional methods of forming color filters of liquid crystal displays are a dye method, a print method, an electrodeposition method, an ink-jet method, and a pigment dispersion method. Recently, the pigment dispersion method, which is advantageous in terms of pattern resolution and manufacturing, has been adopted. This method is applied for manufacturing LCDs of mobile phones, notebook computers, monitors, and TVs.

Now, pigment-dispersed compositions having more improved capabilities, not to mention the pattern resolution, are required. The general pigment-dispersed composition forms colored pixels by coating, exposing, and developing the substrate. In this case, hardening of the exposed pixels makes them insoluble in the developing solution. For this reason, substantial exposure energy is required, and if the exposure energy is insufficient, the light (UV) does not fully reach the lower layer of the coating film. Therefore, the hardness of the lower layer becomes weak and pattern breakup occurs. Also, if the coating solution contains a lot of pigments or if the light blocking is excessive, the pattern breakup becomes intense and much higher exposure energy is required.

If the exposure energy is high, the developing solution does not dissolve the surface of the coating film at all, and the film thickness does not change after developing. On the other hand, if the exposure energy is low, the hardness of the lower layer becomes much lower, which decreases adhesion to the substrate and causes pattern breakup.

In general, the conventional photosensitive resin composition comprises a) a binder soluble in an alkaline solution; b) a crosslinking monomer having at least two ethylene double bonds; c) a pigment; d) a photopolymerization initiator; and e) a solvent. If necessary, it may include additives such as an enhancer for improving adhesion to the substrate, a stabilizer for improving storage stability, and a disperser for improving dispersion of pigments. Generally, this photosensitive resin composition reduces solubility to the developing solution during the developing process, by forming crosslinkages with crosslinking monomers due to radicals of photopolymerization initiators generated by the light. Here, the light blocking due to pigments causes differences in hardness of the upper layer and lower layer. That is, the hardness is lower at the lower layer. This can be the cause of film breakup or undercut by the reaction of the lower layer with the developing solution, if the exposure energy is low.

With variation of small-to-medium-sized device characteristics, differentiated characteristics are required. Formerly, with regard to optimization of the EMB (embossing) process of reflectors for maximizing reflection efficiency of the reflection window, there was an attempt to solve the poor display characteristics in the portion in which there is no ambient light, which is a disadvantage of the reflective LCD, through a front-light, transflective LCD. The recent trend seems to follow the transflective LCD techniques, and the improvement of color filters in this regard is diversely in progress.

Among these, there is an attempt to expand the transmission window portion of the TFT-LCD, and thereby to increase color reproduction of the transmission window on the color filter and maximize reflectivity (transmissivity) rather than color reproduction of the reflective light.

Among these, with regard to change in chromaticity of the reflection window and the transmission window, there is an attempt to secure two tones on the color filter. Generally, securing two tones on the color filter means that the color filter characteristics of the transmission window and the reflection window are divided. With regard to difference of color characteristics of the reflection window and the transmission window, the basic problem is that the path of one is two times that of the other due to the difference of transreflection mode. In order to solve this problem, there are attempts to equalize optical properties of the transmission window and the reflection window by changing the optical property of the reflection window. Among these, there are the Toray method, which drills a hole on the reflection window and additively mixes light passing through the hole and the p.r region (FIGS. 2a, 2b, and 2c), and the Seiko-Epson method which differentiates chromaticity of the transmission window and the reflection window using a change in thickness of the transparent organic insulation film (FIG. 3).

Figure 2A:
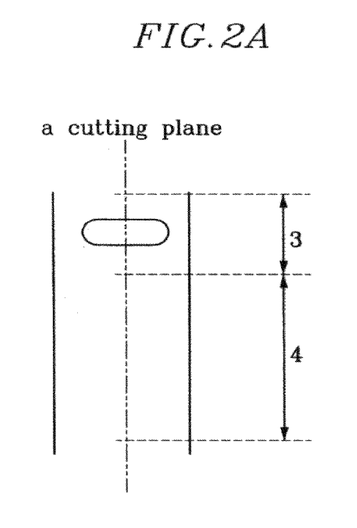
FIGS. 2a, 2b, and 2c show the conventional Toray-type structure.
Figure 2B:
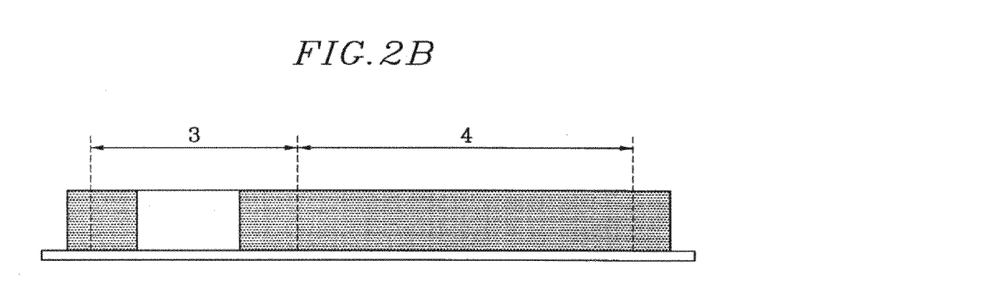
Figure 2C:
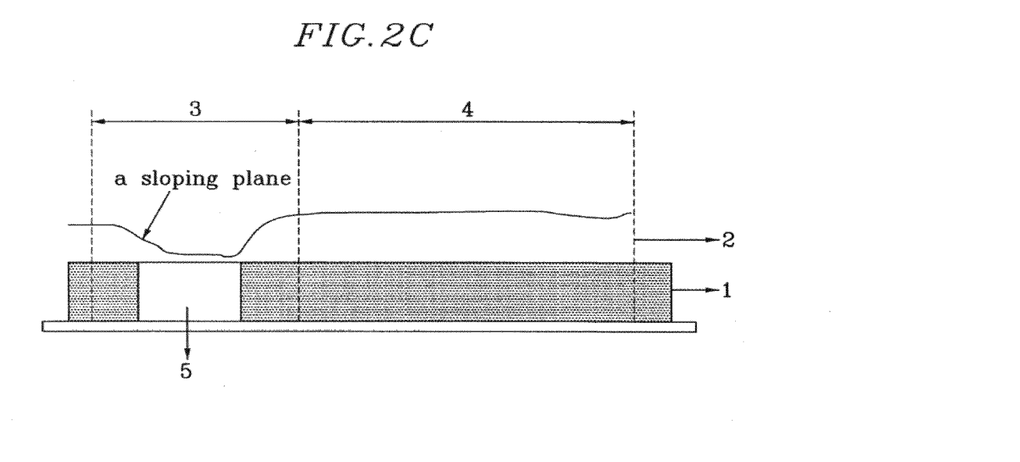

The Toray method secures a chromaticity difference by following the process represented by FIGS. 2a, 2b, and 2c to cause a color difference of the transmission window and the reflection window. However, if the hole size is enlarged to maximize optical efficiency of the reflection window, the following process is affected, which is a problem with respect to controlling liquid crystal around the hole area. In applying an overcoat process to flatten the hole area, if the CF pattern is larger than 1.0 μm, the display characteristics becomes unstable due to the instability of the PI print and rubbing processes.

Figure 3:
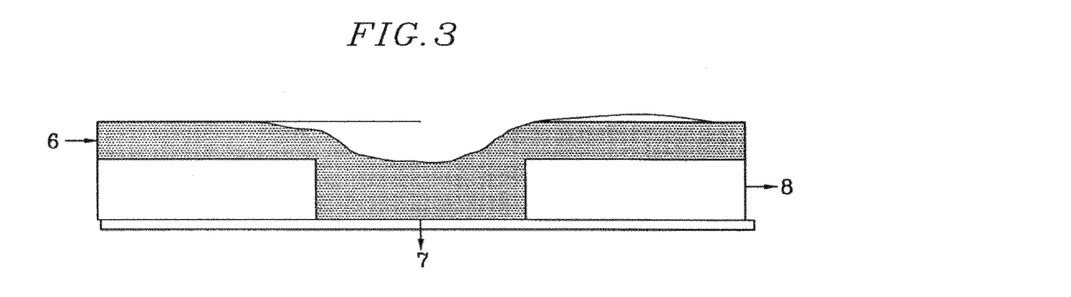
FIG. 3 shows the conventional Seiko-Epson-type structure.

On the other hand, the Seiko-Epson method secures a chromaticity difference by applying the structure of FIG. 3 to cause a color difference of the transmission window and the reflection window. However, an increase of the thickness of the transparent film is necessary to increase the color difference between the reflection window and the transmission window, which causes problems of cell gap and orientation of the liquid crystal.

SUMMARY OF THE INVENTION

The present invention was made in consideration of the problems of the prior art, and it is an object of the present invention to provide a photosensitive resin composition capable of offering gradual solubility to a developing solution after unsaturated exposure due to hardness graduations from the lower layer to the upper layer without regard to the film thickness, and capable of preventing film breakup and undercut through chemical bonding of the substrate and the resin composition.

It is another object of the present invention to provide a photosensitive resin composition capable of forming a film with varying thickness in a single exposure step by exposing with a mask capable of controlling transmissivity and developing the partially hardened resin composition to have variable thickness from the upper layer of the film.

In order to achieve the objects, the present invention provides a photosensitive resin composition for a color filter comprising:

a) 5 to 30 wt % of binder soluble in an alkaline solution;
b) 5 to 30 wt % of a crosslinking monomer having at least two ethylene double bonds;
c) 10 to 60 wt % of a pigment;
d) 1 to 5 wt % of one or more photopolymerization initiators selected from the group consisting of an acetophenone compound, a xanthone compound, a benzoin compound, and an imidazole compound;
e) 0.1 to 2 wt % of one or more lower layer hardeners selected from the group consisting of silane polymer, and an ethylene monomer having at least one epoxy group or an oligomer thereof; and
f) 20 to 80 wt % of a solvent.

Furthermore, the present invention provides a method of double-layer pattern formation comprising steps of exposing and developing a film coated with said color filter photosensitive resin composition using a slit mask.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The symbols represent the following: "1" is an organic film color filter layer (C/F layer); "2" is an organic film overcoat layer (O/C layer); "3" is a reflective portion reflective portion; "4" is a transmissive portion; "5" is a hole; "6" is a reflection window; "7" is a transmission window; and "8" is a transparent layer.

DETAILED DESCRIPTION OF THE PREFERRED EMBODIMENTS

The present invention will now be explained in more detail.

The present invention is characterized by offering a photosensitive resin composition for a color filter capable of forming a film with varying thickness in a single exposure process, by forming a complete pattern at a portion where the light is fully transmitted and offering a thinner film thickness without pattern breakup during developing at a portion where less light is transmitted, by using a slit mask designed to control transmission of exposure light.

In an alkali-soluble photosensitive resin composition for a color filter of the present invention, the binder soluble in an alkaline solution (a) is a copolymer of monomers having ethylene acidic groups and monomers having no ethylene acidic groups in the polymer chain.

For the monomers having ethylene acidic groups, there are acrylic acid, methacrylic acid, itaconic acid, maleic acid, fumaric acid, vinyl acetic acid, acid anhydrides thereof, 2-acryloxyethylhydrogen phthalate, 2-acryloxypropylhydrogen phthalate, and 2-acryloxypropylhexahydrogen phthalate. The content of the monomers having ethylene acidic groups is preferably 10 to 40 wt %, and more preferably 20 to 30 wt %. If the content is below 10 wt %, the solubility of the photosensitive resin composition to the alkaline developing solution decreases. Otherwise, if it exceeds 40 wt %, pattern falling-off and breakup may occur during developing.

For the monomers having no acidic groups, there are isobutyl acrylate, tert-butyl acrylate, lauryl acrylate, alkyl acrylate, steacrylate, cyclohexyl acrylate, isobonyl acrylate, benzyl acrylate, 2-hydroxy acrylate, trimethoxybutyl acrylate, ethylcarbidol acrylate, phenoxyethyl acrylate, 4-hydroxybutyl acrylate, phenoxypolyethyleneglycol acrylate, 2-hydroxyethyl acrylate, 2-hydroxypropyl acrylate, 2-acryloxyethyl2-hydroxypropyl phthalate, 2-hydroxy-3-phenoxypropyl acrylate and methacrylates thereof; acrylates having halogen atoms such a 3-fluoroethyl acrylate and 4-fluoropropyl acrylate, and methacrylates thereof; acrylates having siloxane groups such as triethylsiloxylethyl acrylate and methacrylates thereof; and aromatic olefins such as styrene and 4-methoxystyrene. These compounds can be used alone or in combination. The content of the monomers having no acidic groups in the polymer composition is preferably 60 to 90 wt %, and more preferably 65 to 85 wt %. If the content is below 60 wt %, adhesivity to the glass substrate decreases during developing, so that the pattern breakup becomes intense and the pattern linearity worsens. Otherwise, if it exceeds 90 wt %, the developing time increases.

The content of the binder soluble in an alkaline solution is preferably up to 30 wt % of the entire photosensitive resin composition.

In the photosensitive resin composition of the present invention, for the crosslinking monomer having at least two ethylene double bonds (b), there are 1,4-butanediol diacrylate, 1,3-butyleneglycol diacrylate, ethyleneglycol diacrylate, pentaerythritol tetraacrylate, triethyleneglycol diacrylate, polyethyleneglycol diacrylate, dipentaerythritol diacrylate, sorbitol triacrylate, bisphenol A diacrylate derivatives, trimethylpropane triacrylate, dipentaerythritolpoly acrylate, and methacrylates thereof. The content of the crosslinking monomer having at least two ethylene double bonds is preferably 5 to 30 wt %, and more preferably 5 to 20 wt %, of the entire photosensitive resin composition. If the content is below 5 wt %, pattern formation is difficult due to the low hardness. Otherwise, if it exceeds 30 wt %, excessive hardness causes pattern breakup during developing and worsens pattern linearity.

In the photosensitive resin composition of the present invention, organic pigment or inorganic pigment can be used for the pigment (c). Specific examples of organic pigments are C.I. pigment yellow 83, C.I. pigment yellow 150, C.I. pigment yellow 138, C.I. pigment yellow 128, C.I. pigment orange 43, C.I. pigment red 177, C.I. pigment red 202, C.I. pigment red 209, C.I. pigment red 254, C.I. pigment red 255, C.I. pigment green 7, C.I. pigment green 36, C.I. pigment blue 15, C.I. pigment blue 15:3, C.I. pigment blue 15:4, C.I. pigment blue 15:6, C.I. pigment violet 23, C.I. pigment black 1, and C.I. pigment black 7. For inorganic pigments, there are titanium oxide, titanium black, and carbon black. These pigments can be used alone or in combination. The content of the pigment is preferably 10 to 60 wt % of the entire photosensitive resin composition.

In particular, in the photosensitive resin composition of the present invention, the photopolymerization initiator (d) is a compound that can initiate polymerization of the crosslinking monomer in the wavelength range of visible, UV, and far UV. As mentioned above, one or more compounds selected from the group consisting of an acetophenone compound, a xanthone compound, a benzoin compound, and an imidazole compound can be used for the photopolymerization initiator.

Specific examples of the acetophenone compounds are benzophenone, p-(diethylamino)benzophenone, 2,2-dichloro-4-phenoxyacetophenone, 2,2-diethoxyacetophenone, 2,2-dibutoxyacetophenone, 2-hydroxy-2-methylpropiophenone, and p-t-butyltrichloroacetophenone. Specific examples of the xanthone compounds are xanthone, thioxanthone, 2-methylthioxanthone, 2-isobutylthioxanthone, 2-dodecylthioxanthone, and 2,4-dimethylthioxanthone. Specific examples of the benzoin compounds are benzoin, benzoyl ethyl ether, benzoyl methyl ether, benzoyl propyl ether, and t-butyl benzoyl ether. And specific examples of the imidazole compounds are 2,2-bis-2-chlorophenyl-4,5,4,5-tetraphenyl-2-1,2-biimidazole, and 2,2-bis(2,4,6-tricyanophenyl)-4,4,5,5-tetraphenyl-1,2-biimidazole.

The photopolymerization initiator can be used together with a sensitizer or a hardening promoter, such as 4-dimethylaminobenzophenone, isopropylthioxantone, methyl-o-benzoyl benzoate, 4-(methylphenylthio)-phenyl-phenyl-methane, 2,4-diethylthioxantone, 2-chlorothioxantone, benzophenone, ethylanthraquinone, and 2-mercaptobenzoxazole, if required.

The content of the photopolymerization initiator is preferably 0.5 to 5 wt %, and more preferably 1 to 2 wt %, of the entire photosensitive resin composition. If the content is below 0.5 wt %, pattern formation becomes difficult, and the pattern linearity worsens due to low sensitivity. Otherwise, if it exceeds 5 wt %, there may be problems of storage stability, severe pattern breakup during developing due to high hardness, and residue generation in the region outside the pattern.

In the photosensitive resin composition of the present invention, the lower layer hardener (e) is used to increase hardness of the lower layer. For the lower layer hardener, it is preferable to use one or more compounds selected from the group consisting of a silane polymer, an ethylene monomer having at least one epoxy group, and an oligomer thereof. Typical examples of the silane polymer are vinyltrimethoxysilane, vinyltriethoxysilane, vinyltris(2-methoxyethoxy)silane, 3-aminopropyltriethoxysilane, 3-acryloxypropyltrimethoxysilane, 3-glycidylpropyltrimethoxysilane, 3-glycidylpropyltrimethoxysilane, 3-glycidylpropylmethyldimethoxysilane, 2-(3,4-ethoxycyclohexyl)ethyltrimethoxysilane, 3-chloropropyltrimethoxysilane, and 3-methacrylopropyltrimethoxysilane. These compounds can be use alone or in combination.

For the ethylene monomer having at least one epoxy group or oligomer thereof, there are monomers such as glycidyl acrylate, glycidyl methacrylate, glycidylethyl acrylate, glycidylethyl methacrylate, glycidylpropyl acrylate, glycidylpropyl methacrylate, 3,4-epoxybutyl methacrylate, and 6,7-epoxybutyl acrylate, and oligomers thereof. These compounds can also be use alone or in combination.

The content of the lower layer hardener is preferably 0.1 to 2 wt %, and more preferably 0.1 to 1 wt %, of the entire photosensitive resin composition. If the content is below 0.1 wt %, pattern breakup occurs due to low hardness of the lower layer and poor adhesion to the substrate. Otherwise, if it exceeds 2 wt %, residue may remain because the developing rate of the unexposed portion becomes very low.

In the photosensitive resin composition of the present invention, the solvent (f) is determined by solubility, pigment dispersivity, and coatability. Specifically, ethyleneglycol monomethyl ether acetate, propyleneglycol monomethyl ether, propyleneglycol methyl ether acetate, propyleneglycol monoethyl ether acetate, diethyleneglycol dimethyl ether, diethyleneglycol methylethyl ether, cyclohexanone, 3-methoxyethyl propionate, 3-ethoxymethyl propionate, and 3-ethoxyethyl propionate are preferable. These compounds can be used alone or in combination. The content of the solvent is preferably 20 to 80 wt % of the entire photosensitive resin composition.

Also, the photosensitive resin composition of the present invention can further comprise a (g) disperser for improving dispersivity of the pigment or an additive for improving coatability. For example, a polyester disperser, a polyurethane disperser, a silicon surfactant, or a fluorine surfactant can be used at 0.01 to 1 wt % of the entire photosensitive resin composition.

Figure 1:
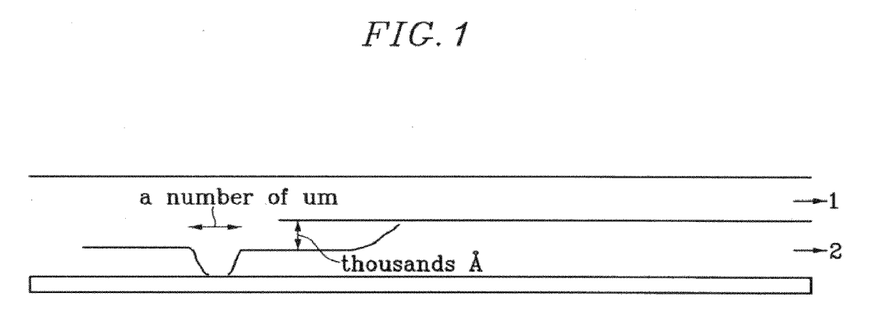
FIG. 1 shows a two-tone structure on a color filter for applying a photosensitive resin composition of the present invention.

Also, the present invention can form a double-layer pattern using the photosensitive resin composition. FIG. 1 shows an example wherein the photosensitive resin composition of the present invention is applied to a mask.

In the present invention, the double-layer pattern formation is performed by applying the coating solution containing pigments on a transparent substrate and removing solvent remaining on the coating film by prebaking. If the coated film is exposed through a mask having a slit pattern, the optical hardness of the pattern portion, the slit portion, and the unexposed portion become different due to differences of exposure energy. The slit portion receives less exposure energy, and the partial hardening offers partial solubility during developing.

For this purpose, the present invention applies the two-tone method on the color filter to maximize optical efficiency of the chromaticity change in the reflection window and the transmission window and to solve the problem of the conventional slit structure. The two-tone method utilizes exposure energy. That is, the optical property is divided according to the film thickness by differentiating the exposure at the transmission window and the reflection window. The present invention is a different version of differentiating thickness of the reflection window and the transmission window in order to respond to the requirement of more than two times the color difference between the reflection window and the transmission window. Accordingly, the present invention can solve the problems of the conventional Toray and Seiko-Epson methods more effectively when obtaining more than ½ tone characteristics as an expansion of the tow-tone method by differentiating the exposure energy.

That is, while the conventional methods secure the same thickness of the reflection window in the two-tone layer, the present invention partially removes the color layer through slit tone design control, as shown in FIG. 1. The color filter structure of the present invention differentiates thickness of the slit portion using bars and spaces of the slit, and removes a color portion (color p.r) due to the exposure energy, which prevents optical filtering and lets the light reflect. Therefore, change in liquid crystal display characteristics can be minimized by reducing film thickness differences of the transmission window. This utilizes the fact that if the film thickness difference and the pattern gap become smaller, the flattening ratio of the overcoat (O/C) film becomes higher. This structure uses color difference due to the film thickness and mixes color by adding light from the reflection window and from the unfiltered portion inside the reflection window, and is a combination of the Toray method and the two-tone method.

Figure 4:
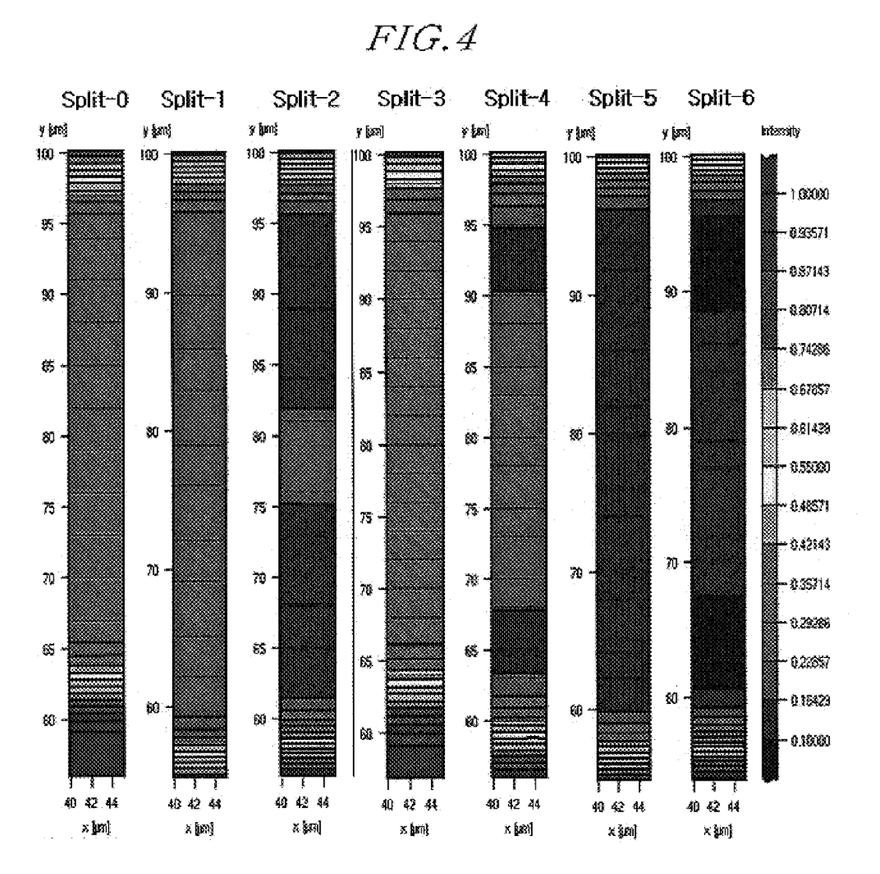
FIG. 4 represents a slit mask pattern obtained by applying the two-tone method of the present invention.

This feature requires color sense calculation per area and optimization of prediction techniques. However, it can be realized when applied to a slit mask design having identical optical density on a plane while having less light at a specific portion, such as Split-6 (FIG. 4).

The slit of the photomask comprises a light-passing portion (WL) and a light-blocked portion (BS). The distance of the light-passing portion and the light-blocked portion can be designed to be 1 to 100 μm in x- and y-axes. Also, the slit of the photomask may have a polygonal pattern having a lattice or curvature in one direction (x- or y-axis) or both directions (x- and y-axes). By changing the area of the light-passing portion and the light-blocked portion, it can be controlled to absorb 10 to 90% of the exposure energy. To be specific, the slit mask has a slit pattern wherein widths of the light-passing portion (WL) and the light-blocked portion (BS) are 1 to 100 μm in x- and y-axes. Also, the slit mask has a lattice pattern wherein widths of the light-passing portion (WL) and the light-blocked portion (BS) are 1 to 100 μm in x- and y-axes.

As mentioned above, unsaturated exposure at the slit portion causes partial hardening and gradual dissolution during developing.

At the upper layer of the film, the reaction of oxygen in the air with the initiator interrupts the initiation reaction, which reduces hardness and increases solubility to the developing solution. The photopolymerization initiator used in the present invention offers the same hardness to the middle layer and lower layer of the film. The lower layer hardener increases hardness of the lower layer of the film through chemical bonding of the organic composition and the substrate, and causes a solubility difference between the upper layer, middle layer, and lower layer of the film, which offers a gradual difference in film thickness during developing.

The photosensitive composition according to the present invention is invulnerable to film breakup during developing even with a small exposure energy, and it does not cause a rapid thickness reduction. Accordingly, the γ-value, which is the change of film thickness according to the exposure energy, decreases, and therefore the thickness of the double-layer structure can be controlled.

The γ-value of the photosensitive composition according to the present invention is preferably below 2.5. More preferably, the γ-value is 0.1 to 2.5. In this case, the film thickness can be reduced to 5 to 90% depending on the exposure energy. More preferably, the γ-value of the photosensitive composition of the present invention is 0.5 to 1.0. In this case, the film thickness can be reduced to 20 to 80%, and the developing margin according to the developing time is best.

For the developing solution used in the developing process, any common alkaline developing solution can be used. Preferably used are a diluted inorganic alkaline aqueous solution such as a potassium hydroxide aqueous solution, a sodium hydroxide aqueous solution, a sodium carbonate aqueous solution, and a potassium carbonate aqueous solution; and an alkaline solution including amines such as a triethanolamine aqueous solution, a trimethylamine aqueous solution, and a tetramethylammonium hydroxide aqueous solution. In general, the developing is performed by a spray method used in LCD processes. However, the dipping method also can be used, and the pattern is formed by the curing process after developing.

Hereinafter, the present invention is described in more detail through Examples and Comparative Examples. However, the following Examples and Comparative Examples are for the understanding of the present invention, and the present invention is not limited to the following Examples. In the following Examples, the percentage and mixing ratio are based on weight, unless stated otherwise.

Example 1

A liquid photosensitive composition was prepared by mixing: 20 wt % of a copolymer of styrene/methacrylic acid/butyl methacrylate (copolymerization ratio=60/20/20; weight-average molecular weight=30,000) as the binder soluble in an alkaline solution (a); 8 wt % of dipentaerythritolhexaacrylate as the crosslinking monomer having at least two ethylene double bonds (b); 20 wt % of C.I. pigment red 254 and 10 wt % of C.I. pigment yellow 139 as the pigment (c); 1 wt % of Irgacure369 (Shiba Specialty Chemical) and 1 wt % of 4,4'-bisdiethylaminobenzophenone as the photopolymerization initiator (d); 0.1 wt % of 3-acryloxypropyltrimethoxysilane (Shin Etsu) as the lower layer hardener (d); and 28 wt % of propyleneglycolmethyl ether acetate and 10 wt % of cyclohexanone as the solvent (f).

Example 2

A photosensitive resin composition was prepared by the same composition and content of Example 1, except that 1 wt % of Irgacure907 (Shiba Specialty Chemical) as the photopolymerization initiator (d) and 0.05 wt % of vinyltriethoxysilane as the lower layer hardener (e) were used.

Example 3

A photosensitive resin composition was prepared by the same composition and content of Example 1, except that 1 wt % of Irgacure369 (Shiba Specialty Chemical) and 1 wt % of isopropylthioxantone as the photopolymerization initiator (d) and 0.2 wt % of 3,4-epoxybutyl methacrylate as the lower layer hardener (e) were used.

Example 4

A photosensitive resin composition was prepared by the same composition and content of Example 1, except that 20 wt % of C.I. pigment green 36 and 10 wt % of C.I. pigment yellow 150 as the pigment (c) and 0.2 wt % of 3-acryloxypropyltrimethoxysilane (Shin Etsu) as the lower layer hardener (e) were used.

Example 5

A photosensitive resin composition was prepared by the same composition and content of Example 1, except that 20 wt % of C.I. pigment blue 15:6 as the pigment (c), 1 wt % of Irgacure369 (Shiba Specialty Chemical) and 1 wt % of 2,4-diethylthioxantone as the photopolymerization initiator (d), and 0.2 wt % of 3-acryloxypropyltrimethoxysilane (Shin Etsu) as the lower layer hardener (e) were used.

Comparative Example 1

A photosensitive resin composition was prepared by the same composition and content of Example 1, except that 2 wt % of 2,4-bistrichloromethyl-6-p-methoxystyryl-s-triazine as the photopolymerization initiator (d) was used, and the lower layer hardener (e) was not used.

Comparative Example 2

A photosensitive resin composition was prepared by the same composition and content of Example 1, except that 20 wt % of C.I. pigment green 36 and 10 wt % of C.I. pigment yellow 150 as the pigment (c), 2 wt % of 2,4-bistrichloromethyl-6-p-methoxystyryl-s-triazine as the photopolymerization initiator (d), and 0.2 wt % of 6,7-epoxybutyl acrylate as the lower layer hardener (e) were used.

Comparative Example 3

A photosensitive resin composition was prepared by the same composition and content of Example 1, except that 30 wt % of C.I. pigment blue 15:6 as the pigment (c) and 1 wt % of Irgacure369 (Shiba Specialty Chemical) and 1 wt % of 4,4'-bisdiethylaminobenzophenone as the photopolymerization initiator (d) were used, and the lower layer hardener (e) was not used.

TABLE 1

| | | Photoinitiator | | |
|---|---|---|---|---|
| | Lower layer hardener | Triazine | Acetophenone compound | Sensitizer |
| Example 1 | 0.05 | — | 1 | 1 |
| Example 2 | 0.05 | — | 1 | — |
| Example 3 | 0.2 | — | 1 | 1 |
| Example 4 | 0.2 | — | 1 | 1 |
| Example 5 | 0.2 | — | 1 | 1 |
| Comp. Example 1 | — | 2 | — | — |
| Comp. Example 2 | 0.2 | 2 | — | — |
| Comp. Example 3 | — | — | 1 | 1 |

Comparison of Developing Characteristics

For the photosensitive compositions of Examples 1 to 5 and Comparatives Example 1 to 3, developing characteristics according to the kinds and contents of the photopolymerization initiator and the lower layer hardener were compared.

Each photosensitive composition prepared in the above Examples and Comparative Examples was spin-coated on a glass substrate at a thickness of 1 μm, and dried on an 80° C. hot plate for 2 min to obtain a coating film.

Then, after positioning a photomask on the film, about 100 to 200 mj/cm$^2$ of exposure was carried out with a 365 nm wavelength light using a superhigh-pressure mercury lamp with a wavelength of 200 nm to 400 nm. Then, the film was developed with a spray nozzle using a KOH developing solution (Dongjin Semichem; DCD-260CF). For the developed fine pattern, the thickness of the exposed portion and the slit portion was determined to evaluate the developing characteristics. The results are shown in Table 2. To determine a solubility difference between the exposed portion and unexposed portion to the developing solution, graphs showing the thickness change according to the exposure energy (FIG. 2 and FIG. 3) were prepared, and the x-values were calculated from the slope. The results are shown in Table 3.

TABLE 2

| | | Thickness after Developing (μm) | | |
|---|---|---|---|---|
| | Exposure energy | Developing time (s) | | |
| | (mj/cm$^2$) | 60 | 80 | 100 |
| Example 1 | 200 | 1.00 | 1.00 | 1.00 |
| | 100 | 1.00 | 0.99 | 0.98 |
| | 20 | 0.3 | 0.3 | — |
| Example 2 | 200 | 1.00 | 1.00 | 1.00 |
| | 100 | 0.99 | 0.80 | 0.50 |
| | 20 | 0.30 | — | — |
| Example 3 | 200 | 1.00 | 1.00 | 1.00 |
| | 100 | 0.99 | 0.98 | 0.98 |
| | 20 | 0.61 | 0.56 | 0.56 |
| Example 4 | 200 | 1.00 | 1.00 | 1.00 |
| | 100 | 0.97 | 0.97 | 0.95 |
| | 20 | 0.55 | 0.50 | 0.48 |
| Example 5 | 200 | 1.00 | 1.00 | 1.00 |
| | 100 | 0.85 | 0.73 | 0.60 |
| | 20 | 0.45 | 0.43 | 0.41 |
| Comp. Example 1 | 200 | 1.00 | 1.00 | 1.00 |
| | 100 | 1.00 | 0.98 | 0.98 |
| | 20 | — | — | — |
| Comp. Example 2 | 200 | 1.00 | 1.00 | 1.00 |
| | 100 | 0.99 | 1.00 | 0.4 |
| | 20 | — | — | — |
| Comp. Example 3 | 200 | 1.00 | 1.00 | 1.00 |
| | 100 | 1.00 | 1.00 | 0.2 |
| | 20 | — | — | — |

TABLE 3

| | γ-Value |
|---|---|
| Example 1 | 1.3 |
| Example 2 | 2.5 |
| Example 3 | 0.9 |
| Example 4 | 0.8 |
| Example 5 | 1.1 |
| Comparative Example 1 | 3.4 |
| Comparative Example 2 | 3.5 |
| Comparative Example 3 | 4.0 |

As shown in Table 3, γ-values of the present invention (Examples 1 to 5) are all low (0.8 to 2.5), and therefore no film breakup occurred during developing even with a low exposure energy, and there were no rapid reductions of film thickness.

As explained above, the photosensitive resin composition according to the present invention can control the γ-value using a new photopolymerization initiator and lower layer hardener. Also, film thickness control according to the exposure energy is possible because the upper layer dissolves without pattern breakup, even with low exposure energy.

What is claimed is:

1. A method of forming a double-layer pattern for display devices, the method comprising:
   coating a photosensitive resin composition on a substrate to form a coating layer, the photosensitive resin compositing containing a lower layer hardener capable of hardening a lower portion of the coating layer;
   exposing light to the coating layer through a photomask having a slit pattern so as to cause unsaturated light-exposure through the slit pattern; and
   developing the light-exposed coating layer, wherein an upper portion of the coating layer is removed due to the unsaturated light-exposure and the lower portion of the coating layer hardened by the lower layer hardener remains, thereby differentiating the thickness of the developed coating layer to have a γ-value of not more than 2.5 after development.

2. The method as claimed in claim 1, wherein the slit pattern includes a light-passing portion (WL) having a width of 1 to 100 μm in x- and y-axes.

3. The method as claimed in claim 1, wherein the slit pattern includes a light-blocked portion (BS) having a width of 1 to 100 μm in x- and y-axes.

4. The method as claimed in claim 1, wherein the slit pattern includes a lattice pattern wherein the width of the light-passing portion (WL) is 1 to 100 μm in x- and y-axes.

5. The method as claimed in claim 1, wherein the slit pattern includes a lattice pattern wherein the width of the light-blocked portion (BS) is 1 to 100 μm in x- and y-axes.

6. The method as claimed in claim 1, wherein the photosensitive resin composition includes: a) 5 to 30 wt % of a binder soluble in an alkaline solution; b) 5 to 30 wt % of a crosslinking monomer having at least two ethylene double bonds; c) 10 to 60 wt % of pigment; d) 1 to 5 wt % of one or more photopolymerization initiators selected from the group consisting of an acetophenone compound, a xanthone compound, a benzoin compound, and an imidazole compound; and e) 20 to 80 wt % of a solvent, and wherein the lower layer hardener includes 0.1 to 2 wt % of 3-acryloxypropyltrimethoxysilane.

7. The method as claimed in claim 6, wherein the binder soluble in an alkaline solution is a copolymer of 10 to 40 wt % of monomers having ethylene acidic groups and 60 to 90 wt % of monomers having no ethylene acidic group.

8. The method as claimed in claim 7, wherein the monomers having ethylene acidic groups are selected from the group consisting of acrylic acid, methacrylic acid, itaconic acid, maleic acid, fumaric acid, vinyl acetic acid, and acid anhydrides thereof, and 2-acryloxyethylhydrogen phthalate, 2-acryloxypropylhydrogen phthalate, and 2-acryloxypropylhexahydrogen phthalate.

9. The method as claimed in claim 7, wherein the monomers having no ethylene acidic group are selected from the group consisting of isobutyl acrylate, tert-butyl acrylate, lauryl acrylate, alkyl acrylate, stearyl acrylate, cyclohexyl acrylate, isobornyl acrylate, benzyl acrylate, 2-hydroxy acrylate, trimethoxybutyl acrylate, ethylcarbitol acrylate, phenoxyethyl acrylate, 4-hydroxybutyl acrylate, phenoxypolyethyleneglycol acrylate, 2-hydroxyethyl acrylate, 2-hydroxypropyl acrylate, 2-acryloxyethyl-2-hydroxypropyl phthalate, 2-hydroxy-3-phenoxypropyl acrylate, and methacrylates thereof; acrylates having a halogen atom and methacrylates thereof; acrylates having s siloxane group and methacrylates thereof; and aromatic olefins.

10. The method as claimed in claim 6, wherein the crosslinking monomer having at least two ethylene double bonds is one or more compounds selected from the group consisting of 1,4-butanediol diacrylate, 1,3-butyleneglycol diacrylate, ethyleneglycol diacrylate, pentaerythritol tetraacrylate, triethyleneglycol diacrylate, polyethyleneglycol diacrylate, dipentaerythritol diacrylate, sorbitol triacrylate, bisphenol A diacrylate derivatives, trimethylolpropane triacrylate, dipentaerythritolpoly acrylate, and methacrylates thereof.

11. The method as claimed in claim 6, wherein the pigment is an organic pigment or an inorganic pigment.

12. The method as claimed in claim 6, wherein the solvent is one or more compounds selected from the group consisting of ethyleneglycol monomethyl ether acetate, propyleneglycol monomethyl ether, propyleneglycol methyl ether acetate, propyleneglycol monoethyl ether acetate, diethyleneglycol dimethyl ether, diethyleneglycol methylethyl ether, cyclohexanone, 3-methoxyethyl propionate, 3-ethoxymethyl propionate, and 3-ethoxyethyl propionate.

13. The method as claimed in claim 6, wherein the ethylene monomer having at least one epoxy group or oligomer thereof is one or more compounds selected from the group consisting of glycidyl acrylate, glycidyl methacrylate, glycidylethyl acrylate, glycidylethyl methacrylate, glycidylpropyl acrylate, glycidylpropyl methacrylate, 3,4-epoxybutyl methacrylate, 3,4-epoxybutyl acrylate, and oligomers thereof.

14. The method as claimed in claim 6, wherein the photosensitive resin composition further includes: 0.01 to 1 wt % of a disperser for improving dispersion of the pigment and an additive for improving coatability, which is one or more compounds selected from the group consisting of a polyester disperser, a polyurethane disperser, a silicon surfactant, and a fluorine surfactant.

* * * * *

UNITED STATES PATENT AND TRADEMARK OFFICE
CERTIFICATE OF CORRECTION

PATENT NO. : 7,611,826 B2 Page 1 of 1
APPLICATION NO. : 12/351398
DATED : November 3, 2009
INVENTOR(S) : Yang et al.

It is certified that error appears in the above-identified patent and that said Letters Patent is hereby corrected as shown below:

Title Page Item (73), Assignee, delete "Samsung Electronics Co., Ltd. (KR)" and insert therefor
--Samsung Electronics Co., Ltd. (KR) and Dongjlm Semichem Co., Ltd. (KR)--.

Signed and Sealed this

First Day of June, 2010

David J. Kappos
*Director of the United States Patent and Trademark Office*

UNITED STATES PATENT AND TRADEMARK OFFICE
CERTIFICATE OF CORRECTION

PATENT NO. : 7,611,826 B2
APPLICATION NO. : 12/351398
DATED : November 3, 2009
INVENTOR(S) : Yang et al.

It is certified that error appears in the above-identified patent and that said Letters Patent is hereby corrected as shown below:

Title Page Item (73), Assignee, delete "Samsung Electronics Co., Ltd. (KR)" and insert therefor --Samsung Electronics Co., Ltd. (KR) and Dongjim Semichem Co., Ltd. (KR)--.

This certificate supersedes the Certificate of Correction issued June 1, 2010.

Signed and Sealed this

Second Day of November, 2010

David J. Kappos
*Director of the United States Patent and Trademark Office*